United States Patent [19]

Miyazaki et al.

[11] Patent Number: 5,290,647
[45] Date of Patent: Mar. 1, 1994

[54] PHOTOMASK AND METHOD OF MANUFACTURING A PHOTOMASK

[75] Inventors: Junji Miyazaki; Hitoshi Nagata, both of Itami, Japan

[73] Assignee: Mitsubishi Denki Kabushiki Kaisha, Tokyo, Japan

[21] Appl. No.: 597,373

[22] Filed: Oct. 10, 1990

[30] Foreign Application Priority Data

Dec. 1, 1989 [JP] Japan ................... 1-310693
Dec. 1, 1989 [JP] Japan ................... 1-310694
Dec. 1, 1989 [JP] Japan ................... 1-310695
Mar. 13, 1990 [JP] Japan ................... 2-59930

[51] Int. Cl.$^5$ ............................................ G03F 9/00
[52] U.S. Cl. ............................................ 430/5; 430/321
[58] Field of Search ................. 430/5, 22, 269, 321, 430/396

[56] References Cited

U.S. PATENT DOCUMENTS 5,045,417  9/1991  Okamoto ........................ 430/5

FOREIGN PATENT DOCUMENTS 57-62052  4/1982  Japan .

OTHER PUBLICATIONS

Levenson et al., "Improving Resolution In Photolithography With A Phase-Shifting Mask", Dec. 1982, pp. 1828-1836.

*Primary Examiner*—Marion E. McCamish
*Assistant Examiner*—S. Rosasco
*Attorney, Agent, or Firm*—Leydig, Voit & Mayer

[57] ABSTRACT

A photomask includes a transparent substrate, a predetermined pattern of a light blocking member disposed on the transparent substrate, and a phase member formed along a peripheral edge of the light blocking member and exposed by a predetermined width. The photomask manufacturing method includes forming a transparent film on a surface of a transparent substrate, forming a predetermined pattern of a light blocking member on the transparent film, forming an etching mask layer on the transparent film and light blocking member, anisotropically etching the etching mask layer to leave the etching mask layer on the transparent film and along a peripheral edge of the light blocking member, and selectively etching the transparent film with the light blocking member and the remaining etching mask layer as a mask to form a phase member of the transparent film along the peripheral edge of the light blocking member.

9 Claims, 10 Drawing Sheets

F I G. 1A
F I G. 1B
F I G. 1C
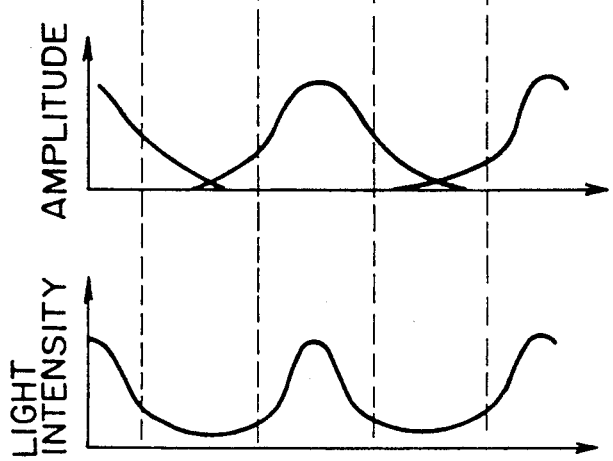
F I G. 5A
F I G. 5B
F I G. 5C
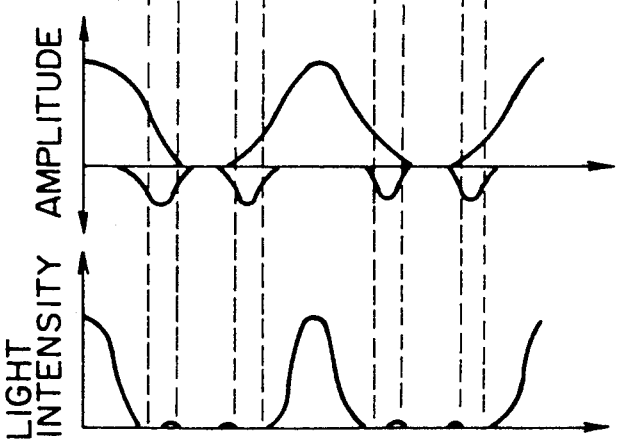

F I G. 6E
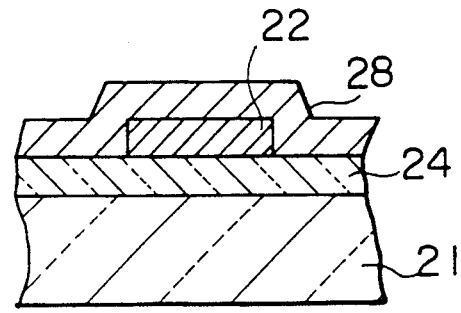
F I G. 6F
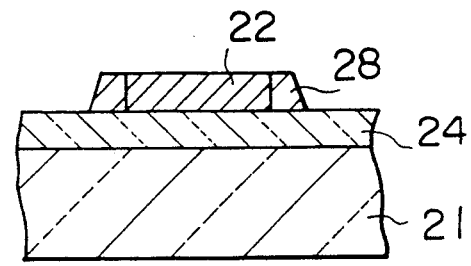
F I G. 6G
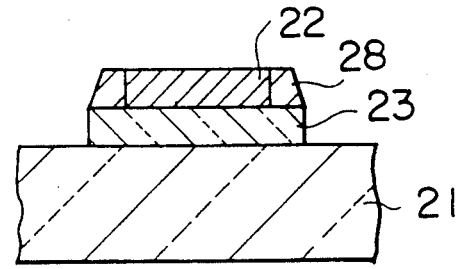
F I G. 6H
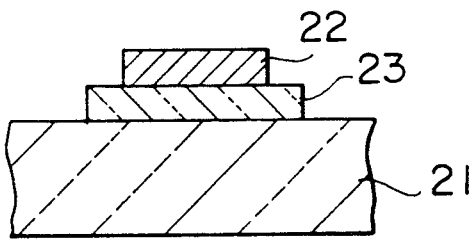
F I G. 7
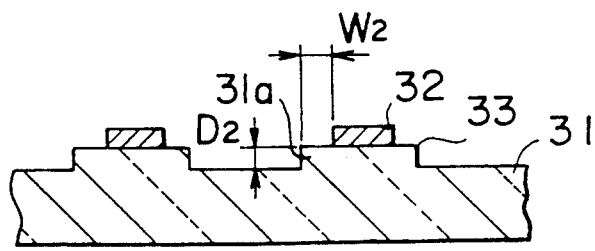

F I G. 8A
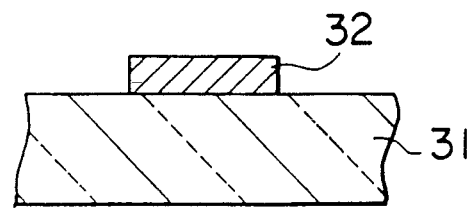
F I G. 8B
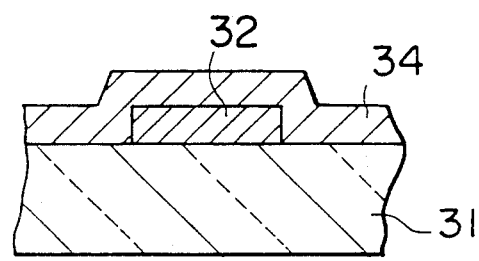
F I G. 8C
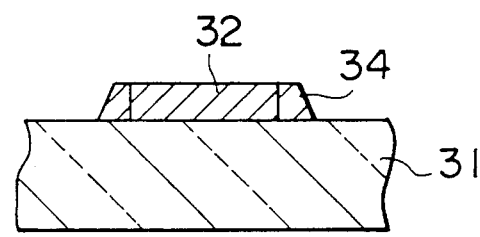
F I G. 8D
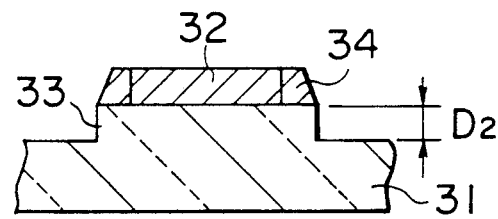
F I G. 8E
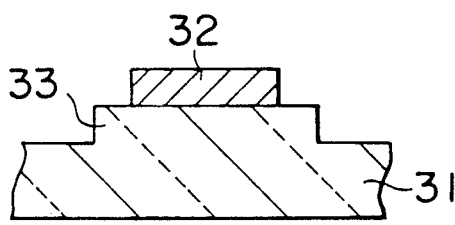

PHOTOMASK AND METHOD OF MANUFACTURING A PHOTOMASK

BACKGROUND OF THE INVENTION

1. Field of the Invention

The present invention relates to a photomask employed in the lithographic process when semiconductor devices or the like are manufactured and a method of manufacturing a photomask.

2. Description of the Related Art

Generally, the lithographic process employs photomasks having the portions which are transparent to an illumination light and those which do not allow light to pass therethrough, both portions forming a predetermined transfer pattern. Such a photomask is projected on a layer of photosensitive material formed on a substrate by a lens system, by which the pattern on the photomask is transferred to the substrate.

FIG. 1A is a section of a conventional photomask. A light blocking member 2, made of Cr or MoSi, is formed on the surface of a transparent substrate 1 made of glass or the like. The light blocking member 2 forms a pattern to be transferred.

The photomask of the above-described type is conventionally manufactured in the manner described below: First, a thin film 3 of Cr is formed on a transparent substrate 1, and an electron beam resist layer 4 is then formed on the thin film 3 of Cr, as shown in FIG. 2A. Next, a pattern transfer is conducted on the electron beam resist layer and the electron beam resist layer 4 is thereby patterned, as shown in FIG. 2B, by drawing a predetermined pattern on the electron beam resist layer 4 with an electron beam 5 and by developing the electron beam resist layer 4. Thereafter, the thin Cr film 3 is etched using the pattern of the electron beam resist layer 4 as a mask to obtain a pattern of light blocking member 2, as shown in FIG. 2C. Finally, the electron beam resist layer 4 is stripped, as shown in FIG. 2D.

In an image of the photomask manufactured in the manner described above which is projected onto the substrate, the light which passes through the transparent substrate 1 bends around the light blocking member 2 due to diffraction, as shown by the amplitude distribution graph of FIG. 1B. The intensity of light obtained in an actual operation is the square of the amplitude, and the light arrives under the light blocking member 2, as shown in FIG. 1C and, reducing the resolution of the pattern transferred and making transfer of a fine pattern with a high degree of accuracy difficult.

Reduction in the resolution due to diffraction is prevented by the phase shifting method. In this method, in the case of a photomask on which transparent portions T1, T2 ... and light blocking portions S1, S2, S3 ... are alternately disposed, a phase member 13 is disposed on every other transparent portion. More specifically, in the transparent portion T2, the phase member 13 is formed on the transparent substrate 11 between the adjacent light blocking members 12, as shown in FIG. 3. The phase member 13 has a thickness which ensures that the phase of the light which passes through the phase member shifts by 180° from that of the light which does not pass through it.

Hence, the light which passes through the transparent portion T1 and bends around the light blocking portion S2 and the light which passes through the transparent portion T2 and arrives under the light blocking portion S2 interfere with each other and thereby cancel each other, resulting in improvement in the resolution.

The photomask shown in FIG. 3 is manufactured in the manner described below. First, a light blocking member 12 having a predetermined pattern is formed on a transparent substrate 11 in the same manner as that shown in FIGS. 2A to 2D, as shown in FIG. 4A. Next, a transparent film 14 is formed on the transparent substrate 11 and on the light blocking member 12, as shown in FIG. 4B. Thereafter, a resist layer is formed on the transparent film 14, and a pattern transfer is then conducted on the resist layer and a resist pattern 15 is thereby formed by drawing a pattern on the resist layer with an electron beam or the like and by developing the resist layer, as shown in FIG. 4C. In this resist pattern 15, the resist layer is left behind alternately on the transparent portions where no light blocking member 12 is provided. Thereafter, the transparent film 14 is etched using the resist pattern 15 as a mask to form a pattern of phase members 13 shown in FIG. 4D. Finally, the resist pattern 15 is stripped.

However, in the photomask shown in FIG. 3, since interference of the light which passes through the transparent portion T2 where the phase member 13 is disposed and of the light which passes through the transparent portion T1 located adjacent to the transparent portion T2 is utilized, the phase shifting method is adopted only for a repetitive pattern in which the transparent portions and the opaque portions are alternately formed.

Furthermore, manufacture of the photomask shown in FIG. 3 includes two pattern transfer processes, one for patterning the resist layer 4 shown in FIG. 2A and the other for forming the resist pattern 15 shown in FIG. 4C. In consequence, the manufacturing method is made complicated, and generation of defective patterns is facilitated. Furthermore, a highly accurate registration of the pattern is required.

SUMMARY OF THE INVENTION

The present invention is directed to eliminating the aforementioned problems of the conventional technology and has an object of providing a photomask which enables a high-resolution pattern to be transferred regardless of the shape of the pattern to be transferred.

Another object of the present invention is to provide a photomask manufacturing method for manufacturing such photomasks easily and with a high degree of accuracy.

The photomask according to the present invention includes a transparent substrate, a light blocking member disposed on the transparent substrate in a predetermined pattern, and a phase member formed such that it projects by a predetermined width from a peripheral edge portion of the light blocking member.

The photomask manufacturing method according to the present invention comprises the steps of forming a transparent film on a surface of a transparent substrate, forming a predetermined pattern of a light blocking member on the transparent film, forming an etching mask layer on the overall surface of the transparent film including that of the light blocking member, anisotropically etching the overall surface of the etching mask layer to selectively and self-conformably leave behind the etching mask layer on the transparent film and along a peripheral edge of the light blocking member, and selectively etching the transparent film with the light blocking member and the remaining etching mask layer as a mask to form a phase member made of the transparent film along the peripheral edge of the light blocking member.

BRIEF DESCRIPTION OF THE DRAWINGS

FIG. 1A is a cross-section of a conventional photomask;

FIGS. 1B and 1C respectively show the amplitude distribution of a projected image of the photomask shown in FIG. 1A and the light intensity distribution thereof;

FIG. 5A is a cross-section of a first embodiment of a photomask according to the present invention;

FIGS. 5B and 5C respectively show the amplitude distribution of a projected image of the photomask shown in FIG. 5A and the light intensity distribution thereof;

FIGS. 6A to 6H are cross-sectional views illustrating processes of manufacturing the photomask shown in FIG. 5A in sequence;

FIG. 7 is a cross-sectional view of a second embodiment of the photomask according to the present invention;

FIGS. 8A to 8E are cross-sectional views illustrating processes of manufacturing the photomask shown in FIG. 7 in sequence;

DESCRIPTION OF THE PREFERRED EMBODIMENTS

Embodiments of a photomask according to the present invention will now be described with reference to the accompanying drawings.

Reference is first made to FIG. 5A which shows a first embodiment of the present invention. In this photomask, a phase member 23 made of a transparent material is formed on the surface of a transparent substrate 21 made of glass or the like, and a light blocking member 22 made of Cr or MoSi is formed on the phase member 23 in a predetermined pattern. The light blocking member 22 is smaller in area than the phase member 23 and thus allows the phase member 23 to project by a predetermined width W1 from the peripheral edge of the light blocking member 22.

The pattern transfer process will be conducted in the manner described below using the above-described photomask. First, the photomask shown in FIG. 5A is illuminated to project an image thereof on a layer of light sensitive material formed on a substrate to be processed (not shown). At that time, since the phase member 23 projects from the peripheral edge of the light-blocking member 22 by the width W1, the phase of the light which passes through that projecting portion is different, by a value corresponding to a thickness D1 of the phase member 23, from that of the light which passes through the portion of the transparent substrate 21 where no phase member 23 is provided.

The thickness D1 of the phase member 23 which assures a phase difference of 180° is obtained as follows:

$$D1 = \lambda/2 \, (n-1) \qquad [1]$$

where $\lambda$ is the wavelength of the illumination, and n is the index of refraction of the phase member 23. The amplitude distribution obtained by projecting an image of the photomask shown in FIG. 5A is shown in FIG. 5B. The light which passes only through the transparent substrate 21 and which bends around the light blocking member 22 due to diffraction interferes with and thereby cancels the light which passes through the phase member 23. In consequence, a sharp light intensity distribution of the image of the photomask, such as that shown in FIG. 5C, is obtained, and a high resolution is thereby obtained. In other words, since the phase member 23 is disposed along the peripheral edge portion of the predetermined pattern of light blocking member 22, a highly accurate pattern transfer is possible even when the light blocking member 22 is not formed in a repetitive pattern.

Figure 2A:
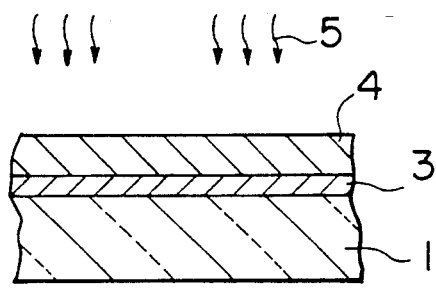
FIGS. 2A to 2D are cross-sectional views illustrating a method of manufacturing the photomask shown in FIG. 1A.
Figure 2B:
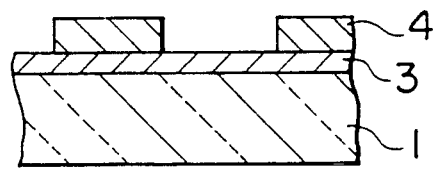
Figure 2C:
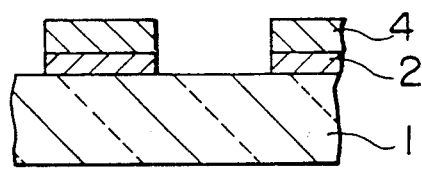
Figure 2D:
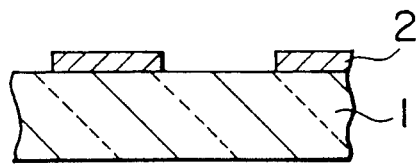
Figure 3:
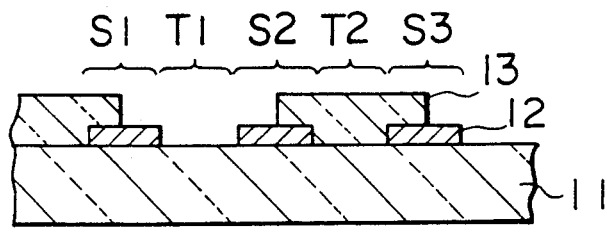
FIG. 3 is a cross-sectional view of another example of the conventional photomask.
Figure 4A:
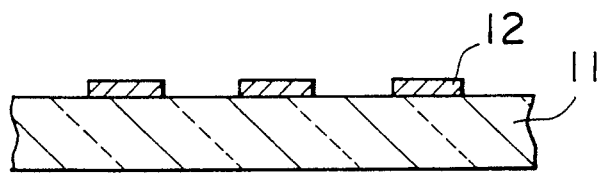
FIGS. 4A to 4D are cross-sectional views illustrating a method of manufacturing the photomask shown in FIG. 3.
Figure 4B:
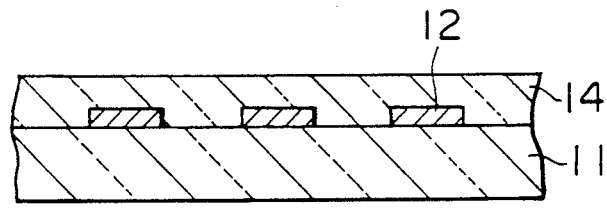
Figure 4C:
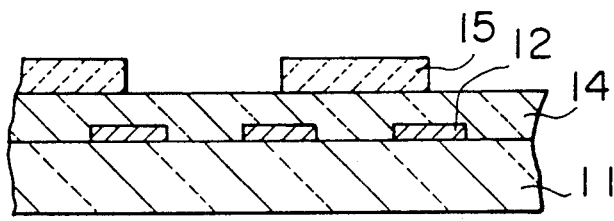
Figure 4D:
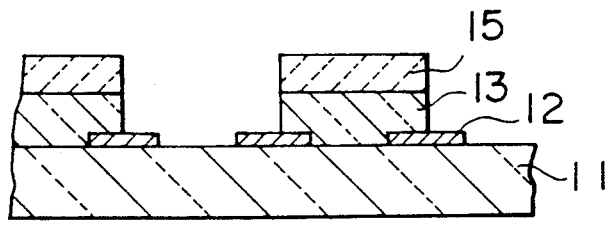
Figure 6A:
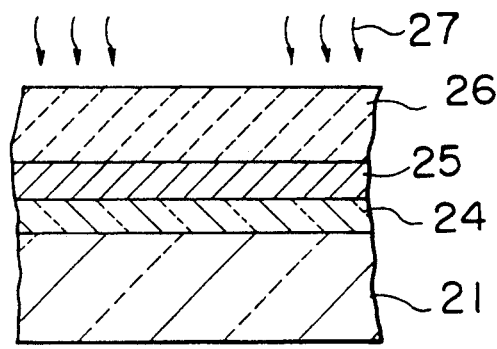
Figure 6B:
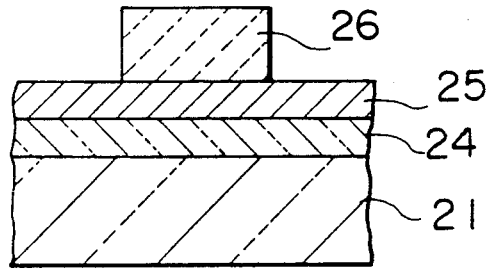
Figure 6C:
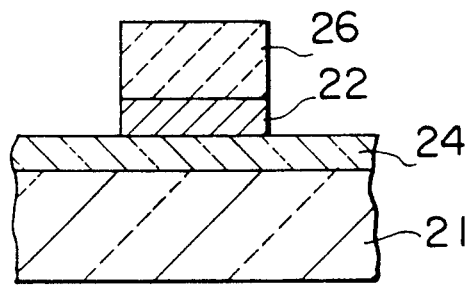
Figure 6D:
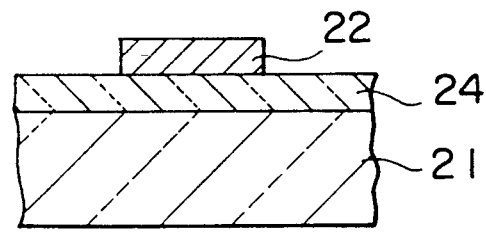

The method of manufacturing the photomask shown in FIG. 5A will be described. First, a transparent film 24 is formed on the transparent substrate 21, and a thin film 25 made of a light blocking material is then formed on the transparent film 24, as shown in FIG. 6A. Next, an electron beam resist layer 26 is formed on the thin film 25. Thereafter, a pattern is transferred to the electron beam resist layer 26 and the electron beam resist layer 26 is thereby patterned, as shown in FIG. 6B, by drawing a predetermined pattern on the electron beam resist layer 26 with an electron beam 27 and developing the electron beam resist layer 26. Thereafter, the thin film 25 is etched with the electron beam resist layer 26 as a mask, as shown in FIG. 6C, and the electron beam resist layer 26 is then removed to obtain a pattern of light blocking member 22, as shown in FIG. 6D.

After the formation of the light blocking member 22 on the transparent film 24, an etching mask layer 28, made of polysilicon, is formed on the overall surface including the surface of the light blocking member 22 and that of the transparent film 24, as shown in FIG. 6E. At that time, the etching mask layer 28 is made thicker by the thickness of the light blocking member 22 in the vicinity of the peripheral edge portion of the light blocking member 22 than at the other portions, as shown in FIG. 6E.

Next, anisotropic etching, such as the reactive ion etching, is conducted on the overall surface of the etching mask layer 28 until the light blocking member 22 and the transparent film 24 are exposed, as shown in FIG. 6F. As stated in connection with the process shown in FIG. 6E, the etching mask layer 28 located in the vicinity of the peripheral edge portion of the light blocking member 22 is thicker by the thickness of the light blocking member 22 than that located at other portions. Consequently, at the end of the anisotropic etching process, the etching mask layer having a height substantially the same as that of the light blocking member 22 is left behind selectively and self-conformably on the transparent film 24 and along the peripheral edge portion of the light blocking member 22.

Subsequently, as shown in FIG. 6G, etching, such as reactive ion etching, is conducted on the transparent film 24 using the light blocking member 22 and the etching mask layer 28 remaining along the peripheral edge portion of the light blocking member 22 as a mask to form a phase member 23 which projects by a predetermined width from the peripheral edge of the light blocking member 22. Thereafter, the etching mask layer 28 remaining along the peripheral edge portion of the light blocking member 22 is removed, as shown in FIG. 6H, thereby completing manufacture of the photomask shown in FIG. 5A.

In this manufacturing method, the pattern transfer is conducted once when the electron beam resist layer 26 is to be patterned, simplifying the manufacturing processes.

Any substance which passes the illumination radiation may be used as the material of the transparent film 24 which forms the phase member 23. Examples include inorganic substances, such as $SiO_2$, $Si_3N_4$, $CaF_2$, and $MgF_2$ and organic substances, such as polymethyl methacrylate (PMMA). The material of the transparent film 24 may be different from or the same as that of the transparent substrate 21. Also, the transparent film 24 may be of multi-layer structure, such as $Si_3N_4/SiO_2$.

The etching mask layer 28 may be made of polysilicon or an organic photo resist, which is either transparent or opaque to the illumination radiation.

FIG. 7 shows a second embodiment of the present invention. In this photomask, raised portions 31a having a height of D2 are selectively formed on the surface of a transparent substrate 31 made of quartz glass or the like, and a predetermined pattern of light blocking members 32 made of Cr or MoSi is formed on the raised portions 31a. Each of the raised portions 31a has a larger area than the corresponding light blocking member 32, and the peripheral portion of the raised portion 31a projects from the light blocking member 32 by a predetermined width of W2, the projecting portion forming a phase member 33.

The method of manufacturing the second embodiment of the photomask will be described below. First, the light blocking member 32, which has a predetermined pattern and which is made of a material opaque to the illumination radiation such as Cr or MoSi, is formed on the transparent substrate 31, as shown in FIG. 8A. The light blocking member 32 is formed in the manner shown in FIGS. 2A to 2D. That is, a thin film made of a light blocking material is formed on the transparent substrate 31, and an electron beam resist layer is then formed on the thin film. Next, the pattern is transferred to the electron beam resist layer by drawing a predetermined pattern on the layer with an electron beam and then by developing the layer. Thereafter, the thin film is selectively etched with the pattern of electron beam resist layer as a mask to obtain a predetermined pattern of light blocking member 32. Finally, the electron beam resist layer is stripped.

After the formation of the light blocking member 32 on the transparent substrate 31, an etching mask layer 34 made of polysilicon is formed on the overall surface of the transparent substrate 31 including that of the light blocking member 32, as shown in FIG. 8B. At that time, the etching mask layer 34 is made thicker by the thickness of the light blocking member 32 in the vicinity of the peripheral edge portion of the light blocking member 32 than at the other portions, as shown in FIG. 8B.

Next, anisotropic etching, such as the reactive ion etching, is conducted on the overall surface of the etching mask layer 34 until the light blocking member 32 and the transparent substrate 31 are exposed, as shown in FIG. 8C. As stated above in connection with the process shown in FIG. 8B, the etching mask layer 34 located in the vicinity of the peripheral edge portion of the light blocking member 32 is thicker by the thickness of the light blocking member 32 than that located at the other portions. In consequence, at the end of the anisotropic etching process, the etching mask layer 34 having a height which is substantially the same as that of the light blocking member 32 is left behind selectively and self-conformably on the transparent substrate 31 and along the peripheral edge portion of the light blocking member 32.

Subsequently, the transparent substrate 31 is etched by the reactive ion etching process or the like to a depth of D2 using the light blocking member 32 and the etching mask layer 34 remaining along the peripheral edge portion of the light blocking member 32 as a mask to form the phase member 33 which projects from the peripheral edge of the light blocking member 32 by a predetermined width, as shown in FIG. 8D. Thereafter, the etching mask layer 34 remaining along the peripheral edge portion of the light blocking member 32 is removed, thereby completing the manufacture of the photomask shown in FIG. 7.

In this manufacturing method, the pattern transfer is conducted only once when the light blocking member 32 is patterned, thus simplifying the manufacturing processes, as in the case of the aforementioned method of manufacturing the photomask according to the present invention.

In a case where the etching mask layer 34 is made of a material which passes illumination radiation of a certain wavelength, the etching mask layer 34 remaining along the peripheral edge of the light blocking member 32 may be left unremoved so that the remaining etching mask layer and the raised portion 31a of the transparent substrate 31 in combination form the phase member. Such a photomask has a structure shown in FIG. 8E.

The pattern transfer process is conducted using the photomask shown in FIG. 7 in the same manner as that in which it is conducted using the photomask shown in FIG. 5A. By setting the thickness D2 of the phase member 33 to a value which ensures that the phase of the light, which passes through the transparent substrate 31 where no raised portion 31a is provided and which arrives under the region of the phase member 33 and that of the light blocking member 32 due to diffraction, shifts by 180° from the phase of the light which passes through the phase member 33, a sharp light intensity distribution and a high resolution can be obtained.

Figure 9:
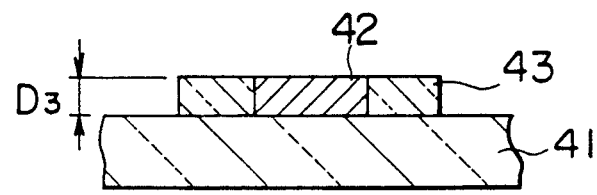
FIG. 9 is a cross-sectional view of a third embodiment of the photomask according to the present invention.

In the aforementioned first embodiment, the light blocking member 22 is formed on the plate-shaped phase member 23. In a third embodiment of the present invention shown in FIG. 9, which will be described below, a light blocking member 42 is formed directly on the surface of a transparent substrate 41 with a phase member 43 formed on the transparent substrate 41 along the peripheral edge of the light blocking member 42.

Figure 10A:
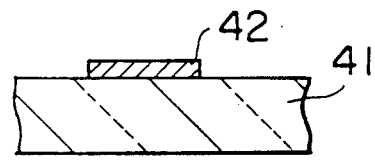
FIGS. 10A to 10C are cross-sections illustrating processes of manufacturing the photomask shown in FIG. 9 in sequence.
Figure 10B:
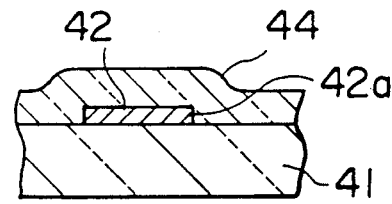

The method of manufacturing this third embodiment of the present invention will now be described. First, the light blocking member 42 having a predetermined pattern is formed on the surface of the transparent substrate 41 made of quartz glass of the like, as shown in FIG. 10A. The predetermined pattern of light blocking member 42 will be formed in the manner shown in FIGS. 2A to 2D. Thereafter, a transparent film 44 is formed on the overall surface of the transparent substrate 41 including that of the light blocking member 42, as shown in FIG. 10B. The transparent film 44 is made of a material which is transparent to the illumination radiation, such as $SiO_2$. At that time, the transparent film 44 is made thicker by the thickness of the light blocking member 42 in the vicinity of a peripheral edge portion 42a of the light blocking member 42 than at the other portions, as shown in FIG. 10B.

Figure 10C:
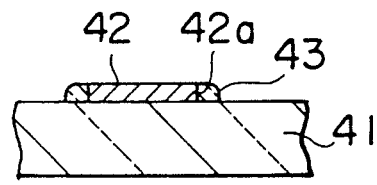

Next, anisotropic etching, such as the reactive ion etching, is conducted on the overall surface of the transparent film 44 until the light blocking member 42 and the transparent substrate 41 are exposed, as shown in FIG. 10C. As stated above in connection with the process shown in FIG. 10B, the transparent film 44 located in the vicinity of the peripheral edge portion 42a of the light blocking member 42 is thicker by the thickness of the light blocking member 42 than that located at the other portions. Consequently, at the end of the anisotropic etching, the transparent film 44 is left behind at a height substantially the same as that of the light blocking member 42 on the transparent substrate 41 and along peripheral edge portion 42a of the light blocking member 42, thereby forming the phase member 43 selectively and self-conformably.

As stated above, since the thickness D3 of the phase member 43 is substantially the same as that of the light blocking member 42, when the light blocking member 42 having a thickness given by Equation [1] is formed on the transparent substrate 41 in the process shown in FIG. 10A, a phase member 43 having a thickness D3 which assures a phase difference of 180° can be obtained.

Figure 11A:
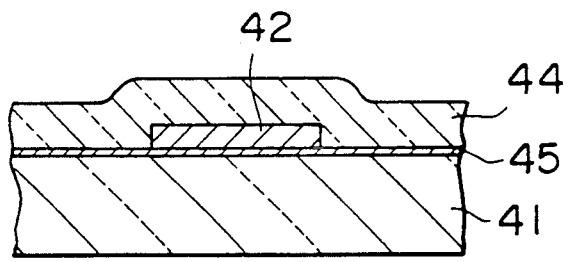
FIGS. 11A and 11B are cross-sectional views illustrating another manufacturing method of the third embodiment.
Figure 11B:
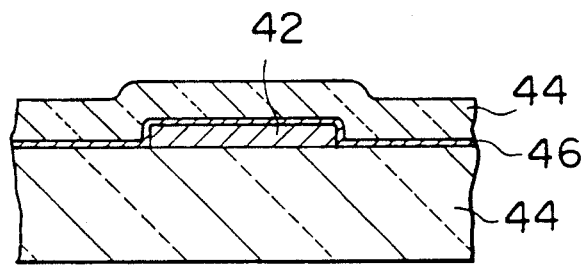

In a case where the transparent substrate 41 and the transparent film 44 are made of the same material, a transparent member 45 or 46 made of a different material may be interposed between the transparent substrate 41 and the transparent film 44 as an etching stopper, as shown in FIG. 11A or 11B, to facilitate etching of the transparent film 44.

Figure 12:
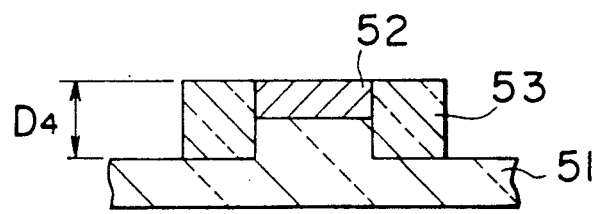
FIG. 12 is a cross-sectional view of a fourth embodiment of the photomask according to the present invention.

In a fourth embodiment of the present invention shown in FIG. 12, a phase member 53 has a large thickness D4, and this is achieved by making a portion of a transparent substrate 51 where a light blocking member 52 is provided thicker than the other portion. The method of manufacturing the fourth embodiment of the present invention will now be described with reference to FIGS. 13A to 13D.

Figure 13A:
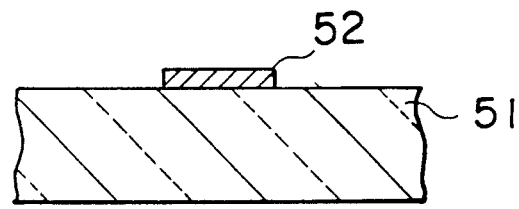
FIGS. 13A to 13D are cross-sectional views illustrating processes of manufacturing the photomask shown in FIG. 12 in sequence.
Figure 13B:
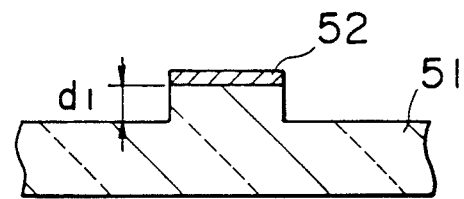
Figure 13C:
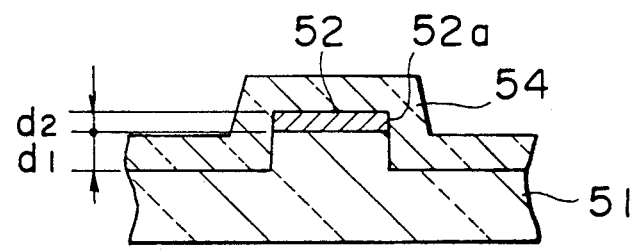

First, the light blocking member 52 having a predetermined pattern is formed on the surface of the transparent substrate 51 made of quartz glass or the like, as shown in FIG. 13A. The predetermined pattern of light blocking member 52 will be formed in the manner shown in FIGS. 2A to 2D. Thereafter, the surface of the transparent substrate 51 is etched into a predetermined depth d1 with the light blocking member 52 as a mask, as shown in FIG. 13B. Next, a transparent film 54 is formed on the overall surface of the transparent substrate 51 including that of the light blocking member 52, as shown in FIG. 13C. The transparent film 54 may be made of a material which is transparent to an illumination radiation, such as $SiO_2$. At that time, the transparent film 54 is thicker by the sum of a thickness d2 of the light blocking member 52 and the etching depth d1 of the transparent substrate 51 in the vicinity of a peripheral edge portion 52a of the light blocking member 52 than at the other portions, as shown in FIG. 13C.

Figure 13D:
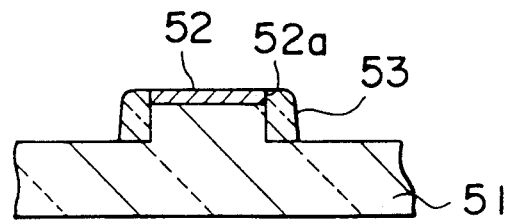

Next, anisotropic etching, such as the reactive ion etching, is conducted on the overall surface of the transparent film 54 until the light blocking member 52 and the transparent substrate 51 and exposed, as shown in FIG. 13D. As stated above in connection with the process shown in FIG. 13C, the transparent film 54 located in the vicinity of the peripheral edge portion 52a of the light blocking member 52 is thicker by the sum of the thickness d2 of the light blocking member 52 and the etching depth d1 of the transparent substrate 51 than that located at the other portions. Consequently, at the end of the anisotropic etching, the transparent film 54 is left behind at a height substantially the same as that of the surface of the light blocking member 52 on the transparent substrate 51 and along the peripheral edge portion 52a of the light blocking member 52, thereby forming the phase member 53 selectively and self-conformably.

As stated above, since the thickness D4 of the phase member 53 is substantially equal to the sum of the thickness d2 of the light blocking member 52 and the etching depth d1 of the transparent substrate 51, the thickness of the phase member 53 can easily be set to a value which assures a phase difference of 180° by controlling the etching depth d1 of the transparent substrate 51.

In the fourth embodiment, etching of the transparent substrate 51 is performed using the light blocking member 52 as a mask. However, a resist layer formed on the light blocking member 52 for patterning the light blocking member 52, like the electron beam resist layer 4 shown in FIG. 2C, may be used as a mask when the transparent substrate 51 is etched, the resist layer being removed thereafter.

Figure 14:
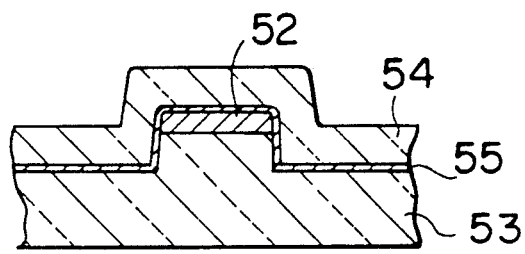
FIG. 14 is a cross-sectional view illustrating another manufacturing method of the fourth embodiment.

Furthermore, in a case where the transparent substrate 51 and the transparent film 54 are made of the same material, a transparent member 55 made of a different material may be interposed between the transparent substrate 51 and the transparent film 54 as an etching stopper, as shown in FIG. 14, to facilitate etching of the transparent film 54.

Figure 15:
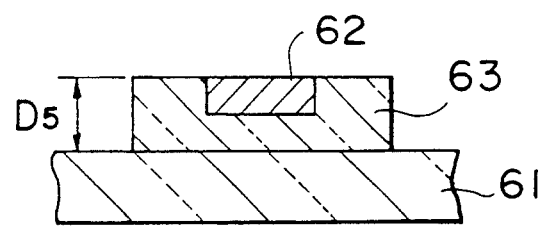
FIG. 15 is a cross-sectional view of a fifth embodiment of the photomask according to the present invention.

Whereas the light blocking member 22 is formed on the flat phase member 23 in the first embodiment, a light blocking member 62 may be buried in the surface of a phase member 63 such that the light blocking member 62 is surrounded by the phase member 63, as in the case of a fifth embodiment of the present invention shown in FIG. 15. The phase member 63 is formed on a transparent substrate 61. The fifth embodiment is effective when it is desired to make the thickness D5 of the phase member projecting from the peripheral edge of the light blocking member 62 large.

Anisotropic etching techniques other than the reactive ion etching technique used in the aforementioned embodiments may also be employed for etching the transparent substrates 31 and 51, the transparent films 24, 44 and 54, and the etching mask layers 28 and 34.

Figure 16:
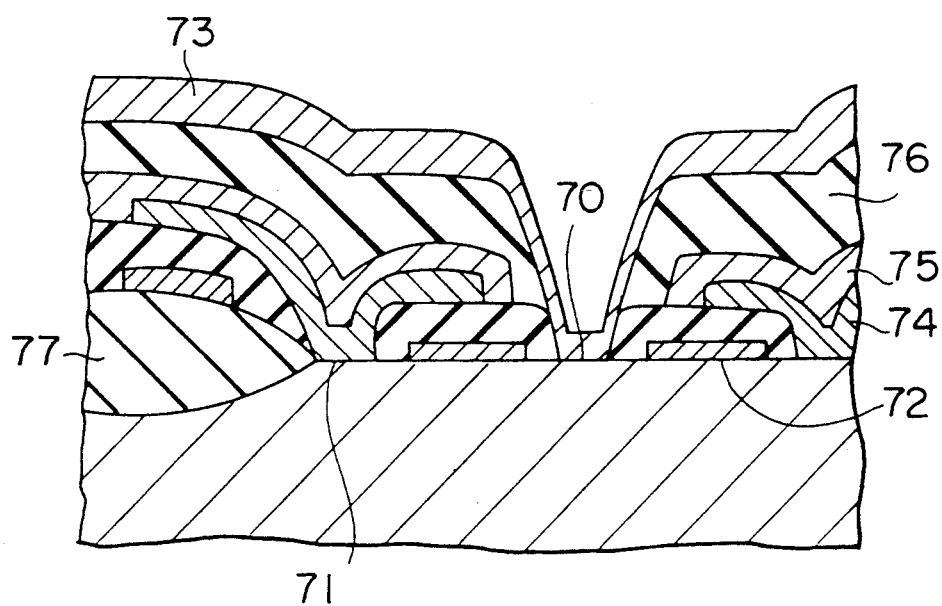
FIG. 16 is a cross-sectional view of the essential parts of a semiconductor device to which the photomask according to the present invention can effectively be adopted.

The photomask according to the present invention enables a highly accurate pattern transfer regardless of the presence or absence of a repetitive pattern, and is thus specifically effective when it is used for pattern transfer in the manufacture of semiconductor devices, such as dynamic RAMs having a large capacity of 16M or 64M, to form fine contact holes 70 and 71 between the electrodes, as shown in FIG. 16. In FIG. 16, a reference numeral 72 denotes a gate electrode which will be a word line, 73 is a wiring electrode which will be a bit line, 74 is an electric charge storing electrode, 75 is an opposing electrode, 76 is an interlayer insulating film, and 77 is a device separating insulating film. In addition to the formation of hole patterns, the photomask according to the present invention may also be employed in the wiring process for the gate electrode. Furthermore, application of the photomask of present invention is not limited to the manufacture of semiconductor devices but it also includes the manufacture of various electronic devices, such as liquid crystal display panels.

What is claimed is:

1. A photomask comprising:
   a transparent substrate;
   a phase shifting member having peripheral edges and disposed on said transparent substrate in a predetermined pattern for shifting the phase of light passing through said phase shifting member; and
   a light blocking member disposed on said phase shifting member and having peripheral edges, the peripheral edges of said phase shifting member projecting by a predetermined width beyond the peripheral edges of said light blocking member.

2. A photomask comprising:
   a transparent substrate having a relatively thick phase portion and thinner supporting portions adjacent said phase portion;
   a light blocking member disposed on said transparent substrate in a predetermined pattern only on said phase portion; and
   phase shifting members disposed on said thinner supporting portions of said substrate adjacent and contacting said light blocking member.

3. A method of manufacturing a photomask comprising:
   forming a transparent film on a surface of a transparent substrate;
   forming on said transparent film a light blocking member in a predetermined pattern having side walls at peripheral edges of said light blocking member;
   forming an etching mask layer on said transparent film and on said covering said light blocking member;
   anisotropically etching said etching mask layer to leave side wall films of said etching mask layer on said transparent film contacting the side walls of said light blocking member;
   selectively etching said transparent film with said light blocking member and said side wall films of said etching mask layer as a mask; and
   removing said side wall films, leaving a phase shifting member of said transparent film extending beyond the peripheral edge of said light blocking member.

4. A method of manufacturing a photomask comprising:
   forming on a transparent substrate a light blocking member in a predetermined pattern having side walls at peripheral edges of said light blocking member;
   forming a transparent film on said transparent substrate and on and covering said light blocking member; and
   anisotropically etching said transparent film to leave side wall films on said transparent film on said substrate contacting the side walls as phase shifting members on said transparent substrate and along the peripheral edge of said light blocking member.

5. A method of manufacturing a photomask according to claim 4, wherein forming said light blocking member includes forming an etching stopper layer of a transparent material on said transparent substrate and subsequently forming said light blocking member on said etching stopper layer.

6. A method of manufacturing a photomask according to claim 4 wherein forming said transparent film includes forming an etching stopper layer of a transparent material on said transparent substrate and on and covering said light blocking member and subsequently forming said transparent film on said etching stopper layer.

7. A method of manufacturing a photomask comprising:
   forming on a transparent substrate a light blocking member in a predetermined pattern having side walls at peripheral edges of said light blocking member;
   selectively etching said transparent substrate where no light blocking member is present to a predetermined depth;
   forming a transparent film on and covering said transparent substrate and said light blocking member; and
   anisotropically etching said transparent film, leaving side wall films of said transparent film on said transparent substrate contacting the side walls of said light blocking member.

8. A method of manufacturing a photomask according to claim 7 wherein forming said transparent film includes forming an etching stopper layer of a transparent material on and covering said transparent substrate and said light blocking member and subsequently forming said transparent film on said etching stopper layer.

9. A method of manufacturing a photomask comprising:
   forming on a transparent substrate a light blocking member in a predetermined pattern having side walls at peripheral edges of said light blocking member;
   forming an etching mask layer on said transparent substrate and on and covering said light blocking member;
   anisotropically etching said etching mask layer to leave side wall films of said etching mask layer on said transparent substrate contacting the side walls of said light blocking member;
   selectively etching said transparent substrate to a predetermined depth using said light blocking member and said side wall films of said etching mask layer as a mask; and
   removing said side wall films, leaving part of said transparent substrate extending beyond the peripheral edges of said light blocking member as a phase shifting member.

* * * * *